United States Patent
Zhou

(10) Patent No.: US 7,411,403 B2
(45) Date of Patent: Aug. 12, 2008

(54) ELECTRICAL SWITCHING APPARATUS AND METHOD EMPLOYING ACTIVE ACOUSTIC SENSING TO DETECT AN ELECTRICAL CONDUCTIVITY FAULT OF A POWER CIRCUIT

(75) Inventor: Xin Zhou, Brookfield, WI (US)

(73) Assignee: Eaton Corporation, Cleveland, OH (US)

( * ) Notice: Subject to any disclaimer, the term of this patent is extended or adjusted under 35 U.S.C. 154(b) by 551 days.

(21) Appl. No.: 11/125,906

(22) Filed: May 10, 2005

(65) Prior Publication Data

US 2006/0254355 A1     Nov. 16, 2006

(51) Int. Cl.
*G01R 31/11*     (2006.01)

(52) U.S. Cl. .......................... 324/500; 324/533; 73/801

(58) Field of Classification Search ................. 324/500, 324/536, 424, 512, 533; 73/801
See application file for complete search history.

(56) References Cited

U.S. PATENT DOCUMENTS

| | | |
|---|---|---|
| 4,165,482 A | 8/1979 | Gale |
| 4,316,139 A | 2/1982 | Root |
| 5,224,006 A | 6/1993 | MacKenzie et al. |
| 5,341,191 A | 8/1994 | Crookston et al. |
| 5,352,984 A | 10/1994 | Piesinger |
| 5,521,840 A | 5/1996 | Bednar |
| 5,530,366 A * | 6/1996 | Nasrallah ................. 324/547 |
| 5,608,328 A | 3/1997 | Sanderson |
| 5,691,869 A | 11/1997 | Engel et al. |
| 5,805,399 A | 9/1998 | Pacholok |
| 6,215,408 B1 | 4/2001 | Leonard et al. |
| 6,522,228 B2 | 2/2003 | Wellner et al. |
| 6,522,509 B1 | 2/2003 | Engel et al. |

(Continued)

OTHER PUBLICATIONS

Innovative Dynamics, Inc., "Wire Chafing Sensor", http://www.idiny.com/chafing.html, 2004, 3 pp. No month's available.

(Continued)

Primary Examiner—Vincent Q Nguyen
(74) Attorney, Agent, or Firm—Martin J. Muran

(57) ABSTRACT

A circuit breaker detects a loose electrical connection condition of a power circuit. The circuit breaker includes first and second lugs, first and second acoustic couplers acoustically coupled to the power circuit, separable contacts electrically connected in series between the first and second lugs, and an operating mechanism adapted to open and close the contacts. An acoustic generator is coupled to the second acoustic coupler and generates a first acoustic signal to the power circuit from the second acoustic coupler. An acoustic sensor is coupled to the first acoustic coupler and has a second acoustic signal which is operatively associated with the loose electrical connection condition. The acoustic sensor outputs a sensed acoustic signal. A circuit cooperates with the acoustic generator to generate the first acoustic signal, input the sensed acoustic signal, and detect the loose electrical connection condition therefrom.

20 Claims, 4 Drawing Sheets

U.S. PATENT DOCUMENTS

| | | |
|---|---|---|
| 6,542,056 B2 | 4/2003 | Nerstrom et al. |
| 6,625,550 B1 | 9/2003 | Scott et al. |
| 6,707,652 B2 | 3/2004 | Engel |
| 6,710,688 B2 | 3/2004 | Wellner et al. |
| 6,720,872 B1 | 4/2004 | Engel et al. |
| 6,734,682 B2 | 5/2004 | Tallman et al. |
| 6,777,953 B2 | 8/2004 | Blades |
| 6,798,211 B1 | 9/2004 | Rockwell et al. |
| 2002/0038199 A1 | 3/2002 | Blemel |
| 2002/0130668 A1 | 9/2002 | Blades |
| 2003/0037615 A1 | 2/2003 | Madaras et al. |
| 2003/0302890 | 10/2003 | Blades |

OTHER PUBLICATIONS

Maroni, C.-S. et al., "Series Arc Detection in Low Voltage Distribution Switchboard Using Spectral Analysis", International Symposium on Signal Processing and its Applications (ISSPA), 2001, pp. 473-476, Aug. 16, 2001.

* cited by examiner

ELECTRICAL SWITCHING APPARATUS AND METHOD EMPLOYING ACTIVE ACOUSTIC SENSING TO DETECT AN ELECTRICAL CONDUCTIVITY FAULT OF A POWER CIRCUIT

BACKGROUND OF THE INVENTION

1. Field of the Invention

This invention pertains generally to electrical switching apparatus and, more particularly, to circuit breakers that detect electrical conductivity faults, such as loose electrical connections, of a power circuit. The invention also pertains to a method for detecting electrical conductivity faults.

2. Background Information

Electrical switching apparatus include, for example, circuit switching devices and circuit interrupters such as circuit breakers, receptacles, contactors, motor starters, motor controllers and other load controllers.

Circuit breakers are generally old and well known in the art. An example of a circuit breaker is disclosed in U.S. Pat. No. 5,341,191. Circuit breakers are used to protect electrical circuitry from damage due to an overcurrent condition, such as an overload condition or a relatively high level short circuit or fault condition. Molded case circuit breakers, for example, include at least one pair of separable contacts which are operated either manually by way of a handle disposed on the outside of the case or automatically by way of an internal trip unit in response to an overcurrent condition. In small circuit breakers, commonly referred to as miniature circuit breakers, used for residential and light commercial applications, such protection is typically provided by a thermal-magnetic trip device. This trip device includes a bimetal, which heats and bends in response to a persistent overcurrent condition. The bimetal, in turn, unlatches a spring powered operating mechanism, which opens the separable contacts of the circuit breaker to interrupt current flow in the protected power system.

Arcing is a luminous discharge of electricity across an insulating medium, usually accompanied by the partial volatilization of electrodes. An arc fault is an unintentional arcing condition in an electrical circuit. Arc faults can be caused, for instance, by worn insulation between adjacent bared conductors, by exposed ends between broken conductors, by faulty electrical connections, and in other situations where conducting elements are in close proximity. Arc faults in systems can be intermittent since the magnetic repulsion forces generated by the arc current force the conductors apart to extinguish the arc. Mechanical forces then bring the conductors together again in order that another arc is struck.

During sporadic arc fault conditions, the overload capability of the circuit breaker will not function since the root-mean-squared (RMS) value of the fault current is too small to activate the automatic trip circuit. The addition of electronic arc fault sensing to a circuit breaker adds one of the elements required for sputtering arc fault protection—ideally, the output of an electronic arc fault sensing circuit directly trips and, thus, opens the circuit breaker. See, for example, U.S. Pat. Nos. 6,710,688; 6,542,056; 6,522,509; 6,522,228; 5,691,869; and 5,224,006, which deal with DC and AC arc fault detection. See, also, U.S. Pat. No. 6,720,872, which deals with a receptacle.

A glowing contact is a high resistance connection, which can form at the interface of a copper wire and a screw terminal, for example, of a receptacle. The resulting temperature rise at this connection point can melt the wire's insulation and damage the receptacle. High resistance connections, such as cause glowing contacts, are most typically "behind the wall" and, thus, are hidden. Hence, it is desirable to be able to detect this condition and interrupt the current before the glowing contact fault progresses to a hazardous condition. See, for example, U.S. Pat. No. 6,707,652.

U.S. Pat. No. 5,608,328 discloses that widespread methods for precisely locating faults in power cables are based on acoustic detection of an arc at the fault. Typically, a surge generator or "thumper" is used to excite the power cable with a series of high-energy electrical pulses which, in turn, prompt audible sparking and vibration at the fault. U.S. Pat. No. 5,608,328 discloses that a series arc, once formed, tends to grow in length by reason of the thermal and electrochemical action of the arc. The arc literally erodes the adjacent contacts thereby assuring, absent human intervention, that the once marginal "opening" will become a full-fledged gap. This gap will continue to sustain an arc for hours or even months until it grows beyond an arc-sustaining maximum. During such periods, electrical and acoustic noise will be produced by the arc. Further, substantial energy will be generated by reason of the volt-amp product associated with the gap/arc which must be dissipated in order to maintain temperatures within safe limits. The arc is detected by detectors that receive electrical radio frequency (RF) noise.

U.S. Pat. No. 6,734,682 discloses a portable arc fault locating and testing device that employs an ultrasonic pick-up coil and an ultrasonic detector in combination with an audible pick-up coil and an audible detector. A circuit determines the correlation between the ultrasonic sound and the audible sound characteristics of an arc fault.

U.S. Pat. No. 6,777,953 discloses a system for locating parallel arcing faults in a set of wires. The system includes a handheld ultrasonic monitor to measure and indicate the distance from the operator to the arc. It measures both the electromagnetic pulse from the arc and the ultrasonic emission from the arc and uses the difference in arrival times to calculate the distance to the arc.

U.S. Pat. No. 6,798,211 discloses a fault distance indicator that locates a fault in a power line by modeling pulses of reflected traveling wave signals which are generated from electrical arcs that occur as a result of the fault. The fault distance indicator is mounted directly on a power line within a transformer enclosure, is powered by a power signal obtained from a transformer secondary and includes a transceiver, such as an infrared transceiver, although radio frequency or ultrasonic transceivers may be used.

U.S. Patent Application Publication No. 2003/0037615 discloses the generation and detection of acoustic guided waves to evaluate the condition of insulation on electrical wiring. For example, suitable transmitter and receiver transducers are broadband acoustic emission piezoelectric transducers. Signal transmission occurs at one location on the electrical wire to be evaluated and detection occurs at one or more locations along the electrical wire. The number and position of the detection locations depends on the user's preference. In one embodiment, transmission and detection occurs at one location, which is especially effective for evaluating the termination points of wire, such as at connectors, as well as for detecting signals reflected from flaws. For connectors, one transducer can be used to transmit the signal to the connector and detect the reflected signal. The transducer would be positioned as close as possible to the connector. In another embodiment, detection occurs at one or more locations separate from the transmitting location. Two simultaneous measurements can be taken to generate both attenuation and speed values.

The web site at http://www.idiny.com/chafing.html states that a wire chafing sensor is a passive solution to the problem of wire chafing detection by listening to noise signatures in the wire. This also states that the system can detect wire chafing, arcing and burning, and that pattern recognition software categorizes degrees of chafing.

One prior proposal for loose electrical connection detection utilizes relatively high voltage pulses to detect the associated break that could occur across such a loose electrical connection. The problems associated with this proposal include: (1) the possibility of damage to the corresponding electrical circuitry; and (2) the possible introduction of a relatively high noise-to-signal ratio in the electrical circuit, which may distort the true signal. Also, system stimulation and response monitoring may miss many loose intermittent events.

There is room for improvement in electrical switching apparatus, such as, for example, arc fault circuit breakers and receptacles, and in methods for detecting electrical conductivity faults.

SUMMARY OF THE INVENTION

These needs and others are met by the present invention, which employs active acoustic signals and their reflection/transmission through a power circuit, such as an electrical wiring system, to detect an electrical conductivity fault, such as, for example, a loose or intermittent electrical connection.

The disclosed acoustic method provides real time detection of electrical conductivity faults. For example, an acoustic generator is coupled to the electrical wiring system and emits an acoustic signal at a predetermined frequency. An acoustic sensor, such as, for example, a piezo electrical sensor, is coupled to the electrical wiring system to "listen" to acoustic noises conducted through the electrical wiring. The reflection/transmission of this acoustic signal across an electrical conductivity fault is detected by the acoustic sensor. Based on sensed characteristics, such as, for example, intensity, the acoustic sensor determines if there is an electrical conductivity fault.

In accordance with one aspect of the invention, an electrical switching apparatus for detecting an electrical conductivity fault of a power circuit comprises: first and second lugs adapted to be electrically connected to the power circuit; a first acoustic coupler adapted to be acoustically coupled to the power circuit; a second acoustic coupler adapted to be acoustically coupled to the power circuit; separable contacts electrically connected in series between first and second lugs; an operating mechanism adapted to open and close the separable contacts; an acoustic generator coupled to the second acoustic coupler, the acoustic generator being adapted to generate a first acoustic signal to the power circuit from the second acoustic coupler; an acoustic sensor coupled to the first acoustic coupler, the first acoustic coupler having a second acoustic signal which is operatively associated with the electrical conductivity fault of the power circuit, the acoustic sensor being adapted to output a sensed acoustic signal; and a circuit cooperating with the acoustic generator to generate the first acoustic signal, input the sensed acoustic signal and detect the electrical conductivity fault therefrom.

The acoustic generator may generate the first acoustic signal as a plurality of pulses having a predetermined frequency.

The circuit may be adapted to input a plurality of samples of the sensed acoustic signal, determine a plurality of magnitudes of the samples, determine an average magnitude from the magnitudes of the samples, determine a change in the average magnitude with respect to a first predetermined value for the sensed acoustic signal, and determine the electrical conductivity fault when the change is greater than a second predetermined amount.

As another aspect of the invention, a method of detecting an electrical conductivity fault of a power circuit comprises: employing a first acoustic coupler adapted to be acoustically coupled to the power circuit; employing a second acoustic coupler adapted to be acoustically coupled to the power circuit; generating a first acoustic signal from the second acoustic coupler to the power circuit; inputting a second acoustic signal from the first acoustic coupler, the second acoustic signal being operatively associated with the electrical conductivity fault of the power circuit, and outputting a sensed acoustic signal; and detecting the electrical conductivity fault from the sensed acoustic signal.

The method may include generating the first acoustic signal as a plurality of pulses having a predetermined frequency; inputting a plurality of samples of the sensed acoustic signal; and determining that the frequency of the samples matches the predetermined frequency before detecting the electrical conductivity fault from the samples.

The method may comprise outputting a trip signal to a trip mechanism to interrupt the electrical conductivity fault responsive to the detecting the electrical conductivity fault. The method may output an alarm responsive to the detecting the electrical conductivity fault.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

As employed herein, the term "acoustic" shall expressly include, but not be limited by, one or more sounds that are subsonic, sonic and/or ultrasonic.

As employed herein, the term "electrical conductor" shall expressly include, but not be limited by, a wire (e.g., solid; stranded; insulated; non-insulated), a copper conductor, an aluminum conductor, a suitable metal conductor, or other suitable material or object that permits an electric current to flow easily.

As employed herein, the term "lug" shall expressly include, but not be limited by, a terminal or other electrically conductive fitting to which one or more electrical conductors are electrically and mechanically connected.

As employed herein, the term "electrical conductivity fault" means a loose or other intermittent electrical connection of an electrical conductor and/or of a lug.

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

As employed herein, the term "acoustic coupler" shall expressly include, but not be limited by, an acoustic lug; or a clamp or other suitable coupling mechanism to hold an electrical conductor and an acoustic sensor or an acoustic generator together to allow effective acoustic transmission with or without an electrical connection.

The present invention is described in association with an arc fault circuit breaker, although the invention is applicable to a wide range of electrical switching apparatus.

Figure 1:
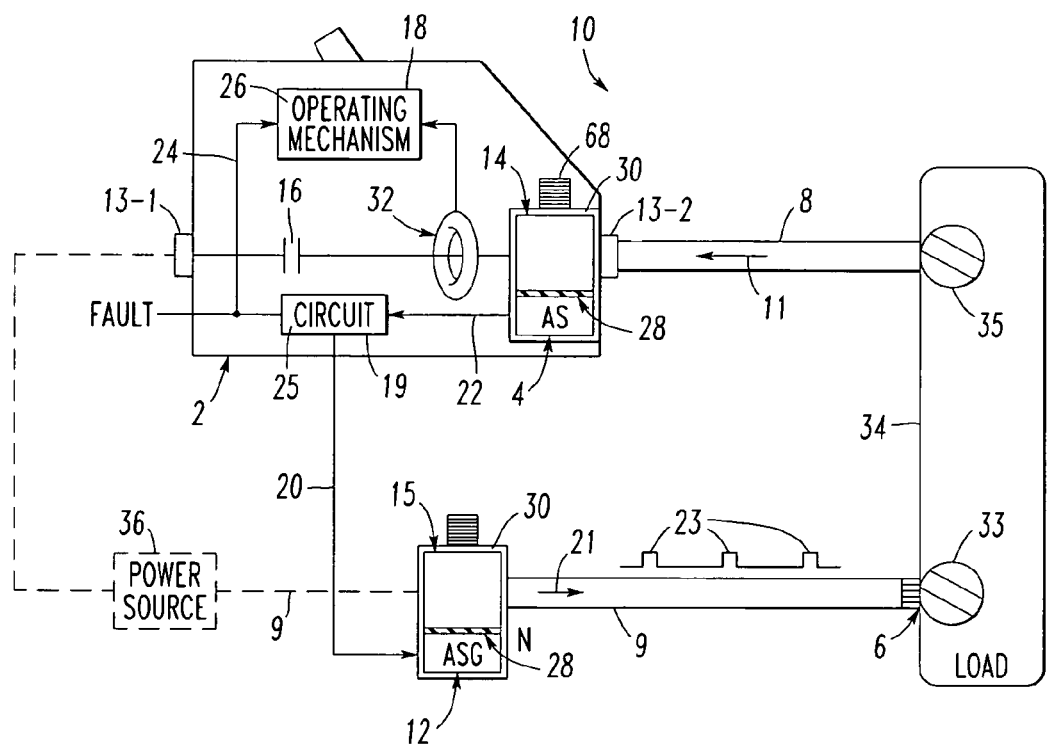
FIG. 1 is a block diagram of a circuit breaker employing an acoustic generator and an acoustic sensor to detect a loose electrical connection condition in accordance with the present invention.

FIG. 1 shows an electrical switching apparatus, such as a circuit interrupter (e.g., circuit breaker 2), employing a suitable acoustic sensor (AS) 4 (e.g., without limitation, a Piezo electrical sensor) to detect an electrical conductivity fault, such as a loose electrical connection condition 6, in or associated with an electrical conductor, such as 8 or 9, of a power circuit 10. An electrical conductor-conducted acoustic signal 11 from the loose electrical connection condition 6 and originating from a suitable acoustic signal (e.g., without limitation, pulse) generator (ASG) 12 is sensed by the acoustic sensor 4, in order to provide acoustic loose electrical connection detection, as will be described.

The acoustic sensor 4 is suitably acoustically coupled to the electrical conductor 8 in order to "listen" for conducted sound. The circuit breaker 2 includes a first lug, such as a line terminal 13-1, a second lug, such as a load terminal 13-2, and a first acoustic coupler 14 acoustically coupled to the load terminal 13-2. The second lug 13-2 is adapted to be electrically connected to the power circuit (e.g., load) electrical conductor 8, as shown.

A second acoustic coupler 15 for the acoustic signal generator 12 is somewhat similar to the first acoustic coupler 14, although, in this example, the coupler 15 is external to the circuit breaker 2 and is adapted to be acoustically coupled to the power circuit (e.g., load neutral) electrical conductor 9, as shown.

The circuit breaker 2 also includes separable contacts 16 electrically connected in series between the line terminal 13-1 and the load terminal 13-2, and an operating mechanism 18 adapted to open and close the separable contacts 16. The acoustic sensor 4 is suitably coupled to the acoustic coupler 14 and is adapted to sense the acoustic signal 11 from the acoustic coupler 14.

The circuit breaker 2 further includes a circuit 19 outputting a signal 20 to the acoustic signal generator 12 to generate an output acoustic signal 21 from the acoustic signal generator 12, input a sensed acoustic signal 22 from the acoustic sensor 4, and detect the loose electrical connection condition 6 therefrom and output a detected fault signal 24, as will be described.

The acoustic coupler 15 couples the output acoustic signal 21 from the acoustic signal generator 12 to the power circuit 10, and the acoustic coupler 14 couples the acoustic signal 11 from the power circuit 10 to the acoustic sensor 4. In particular, the acoustic signal generator 12 is coupled to the acoustic coupler 15 and is adapted to generate the output acoustic signal 21 to the power circuit 10 from the acoustic coupler 15. For example, as will be discussed below in connection with FIG. 2, the acoustic signal generator 12 generates the output acoustic signal 21 as a plurality of pulses 23 having a predetermined frequency. The acoustic sensor 4 is coupled to the acoustic coupler 14, which has the acoustic signal 11 that is operatively associated with the loose electrical connection condition 6. The acoustic sensor 4 inputs the acoustic signal 11 from the acoustic coupler 14 and outputs the sensed acoustic signal 22.

EXAMPLE 1

The circuit breaker 2 may be, for example, an arc fault circuit interrupter. The operating mechanism 18 may include a trip mechanism 26, and the circuit 19 may output the detected fault signal 24 as a trip signal to the trip mechanism 26 upon detecting the loose electrical connection condition 6 from the sensed acoustic signal 22, in order to interrupt the condition 6.

EXAMPLE 2

The example acoustic coupler 14 is preferably structured to match the acoustic wave-guide provided by the electrical conductor 8. The acoustic coupler 14 preferably includes suitable acoustic wave-guide properties that couple the acoustic signal 11 from the power circuit 10 to the acoustic sensor 4.

EXAMPLE 3

The acoustic coupler 14 may be an acoustic lug including a voltage (e.g., a line voltage from the line terminal 13-1) adapted to be electrically output to the power circuit 10. The acoustic lug preferably includes a suitable electrical insulator 28 (e.g., a relatively thin insulating polymer or ceramic) adapted to electrically insulate the acoustic sensor 4 from the voltage.

EXAMPLE 4

The acoustic coupler 14 preferably includes a suitable acoustic insulator 30 (e.g., without limitation, an acoustic insulation foam pad wrapped around the acoustic coupler 14 and the acoustic sensor 4), such as a suitable mount and suitable acoustic insulation, adapted to insulate the acoustic sensor 4 from airborne noise.

EXAMPLE 5

In this example, the circuit breaker 2 also includes a current sensor 32, which may be employed by the trip mechanism 26, or which need not be employed.

EXAMPLE 6

The acoustic signal generator 12 generates as the output acoustic signal 21 the acoustic pulses 23 at a suitable predetermined frequency (e.g., without limitation, about 8 Hz). The acoustic signal 21 propagates through the electrical conductor 9, is modified by the loose electrical connection condition 6, and the resulting acoustic signal 11 is detected by the acoustic sensor 4. The acoustic signal 11 is, thus, operatively associated with the power circuit loose electrical connection condition 6.

EXAMPLE 7

The electronic circuit 19 for the acoustic sensor 4 first determines whether the sensed acoustic signal 22 really comes from the acoustic signal generator 12. This may be accomplished by determining the detected acoustic pulse rate which has the predetermined frequency (e.g., without limitation, about 8 Hz). Then, the electronic circuit 19 records the magnitude of a plurality of the detected acoustic pulses (e.g., without limitation, the latest samples 25 corresponding to about 5 to about 10 of the acoustic pulses 23) and then monitors the average value of those magnitudes. If the change of the average value is greater than a predetermined percentage (e.g., without limitation, about 5%), then the fault signal 24 is output by the electronic circuit 19 to annunciate the loose electrical connection condition 6.

EXAMPLE 8

In this example, the load neutral terminal 33 of load 34 includes the loose electrical connection condition 6. Alternatively, such condition may be at the load terminal 35, internal to the load 34, in the lug 13-2, in the electrical conductor 8 and/or in the electrical conductor 9.

EXAMPLE 9

Although the example power circuit 10 includes a neutral conductor (N) as the electrical conductor 9, the invention is applicable to power circuits which do not employ a neutral conductor and to electrical switching apparatus that receive or do not receive the neutral conductor 9. For example, the acoustic signal generator 12 may be external to (as shown), internal to, or otherwise integrated with or associated with the circuit breaker 2.

EXAMPLE 10

Alternatively, the acoustic signal generator 12 and the coupler 15 may be coupled to the load conductor 8, and the acoustic sensor 4 and the coupler 14 may be coupled to the neutral conductor 9.

EXAMPLE 11

The circuit breaker 2 is electrically connected between a power source 36 at the circuit breaker line terminal 13-1 and the load 34 at the load terminal 35. The electrical conductor (neutral) 9 is also electrically connected to the power source 36.

EXAMPLE 12

The power circuit 10 may be a direct current power circuit.

EXAMPLE 13

The power circuit 10 may be an alternating current power circuit.

EXAMPLE 14

The circuit 19 may output the detected fault signal 24 as an alarm signal.

Figure 2:
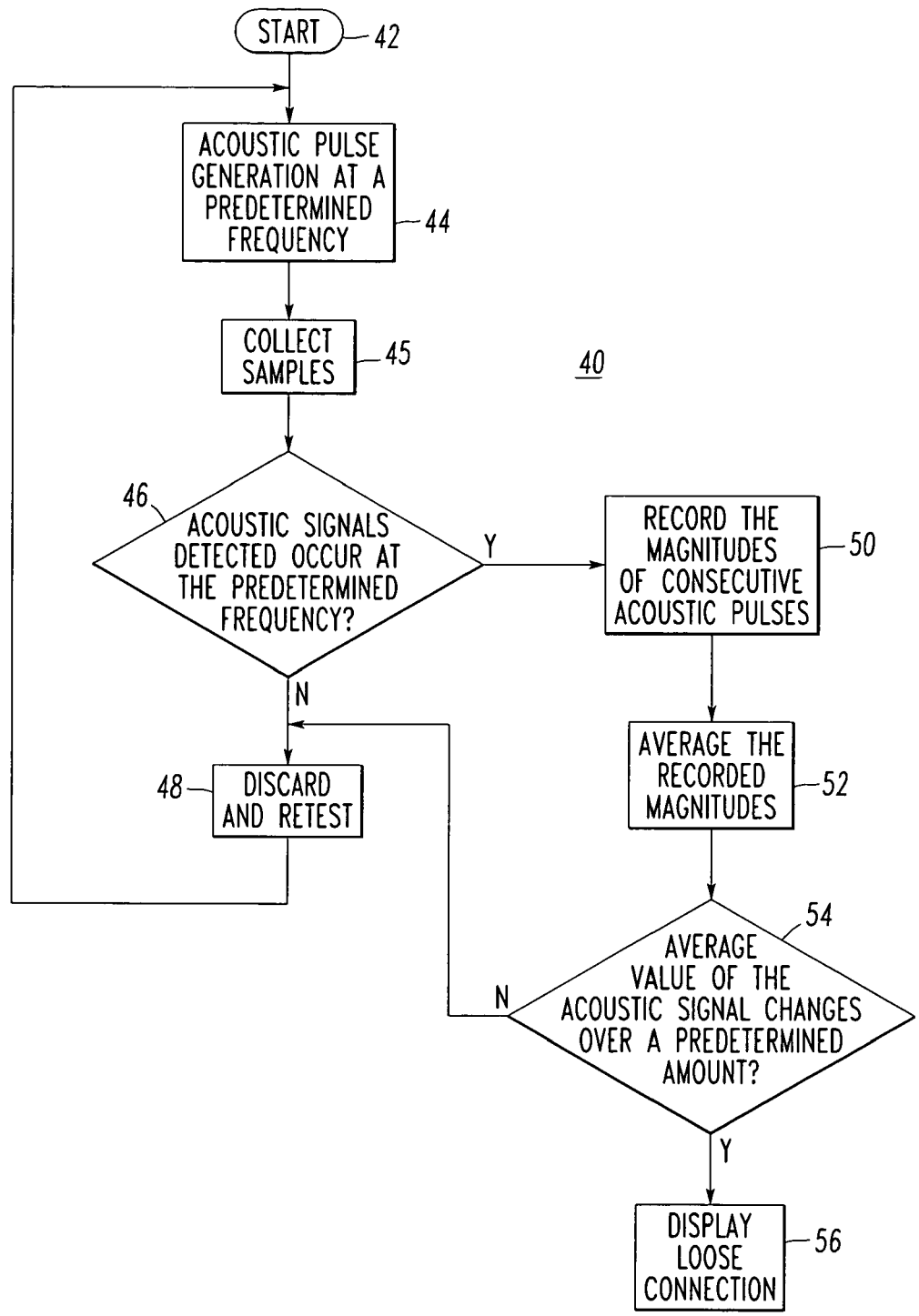
FIG. 2 is a flowchart of a routine executed by the circuit of FIG. 1 to detect a loose electrical connection using active acoustic sensing.

FIG. 2 is a flowchart of a routine 40 executed by the circuit 19 (e.g., a suitable processor) of FIG. 1 to detect an electrical conductivity fault, such as the loose electrical connection condition 6, using active acoustic sensing. After the routine 40 starts at 42, acoustic pulse generation at a predetermined frequency (e.g., other than at a line frequency, such as 60 Hz, and its harmonics) is initiated at 44. For example, this outputs the signal 20, which corresponds to the generated acoustic pulses 23 of the acoustic signal 21. Next, at 45, the plural samples 25 are input from the sensed acoustic signal 22. Then, at 46, it is determined if the frequency of the samples 25 of the sensed acoustic signal 22 suitably matches the predetermined frequency. If not, then at 48, the samples 25 are discarded and another test is run at 44.

On the other hand, if the samples 25 occur at the predetermined frequency (e.g., within a suitable range of frequencies), then the magnitudes of those samples 25 (e.g., corresponding to about 5 to about 10 of the consecutive pulses 23) are determined and saved at 50. Then, at 52, the average value of the magnitudes of those samples 25 is determined. Next, at 54, it is determined if that average value changes by more than a predetermined amount (e.g., without limitation, a suitable percentage; about 5%) with respect to the average value of a suitable baseline set of samples of the sensed acoustic signal 22. For example, the baseline set of samples may be obtained after the circuit breaker 2 is first installed, wired and powered up with suitable knowledge (e.g., without limitation, approximate wire length; number of electrical connections) of the power circuit 10, in order that the normal attenuation of the acoustic signal 21, without a loose electrical connection, may be suitably estimated or measured. If the test fails at 54, then step 48 is executed. Otherwise, at 56, the signal 24 is output to display the determination of the electrical conductivity fault, such as the loose electrical connection condition 6.

EXAMPLE 15

Figure 3:
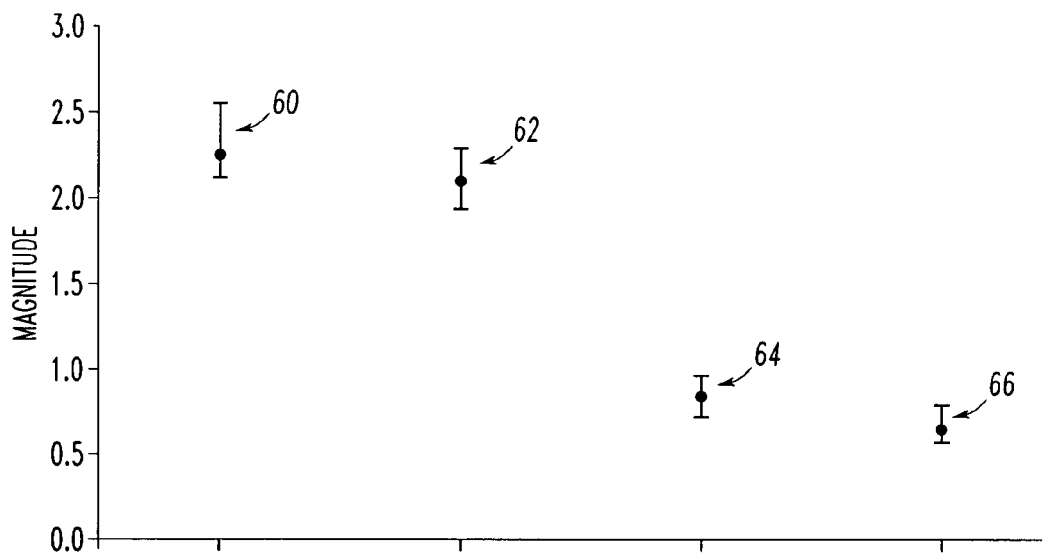
FIG. 3 plots ranges of sample average acoustic pulse magnitudes as sensed by the acoustic sensor of FIG. 1 with various different electrical connection conditions of the load terminal screw.

FIG. 3 plots ranges 60,62,64,66 of sample average acoustic pulse magnitudes as sensed by the acoustic sensor 4 of FIG. 1 with various different electrical connection conditions of the load terminal screw 68, in order to mimic different loose electrical connections. The range 60 corresponds to the terminal screw 68 being relatively tight. The ranges 62 and 64 correspond to the terminal screw 68 being loosened by 1.5 turns and being completely removed with the conductor 8 still electrically touching the lug 13-2 such that there is load current, respectively. For the range 66, the terminal screw 68 is completely removed, the conductor 8 is electrically disconnected from the lug 13-2, but still in contact with the insulated circuit breaker housing, and there is no load current.

EXAMPLE 16

Figure 4:
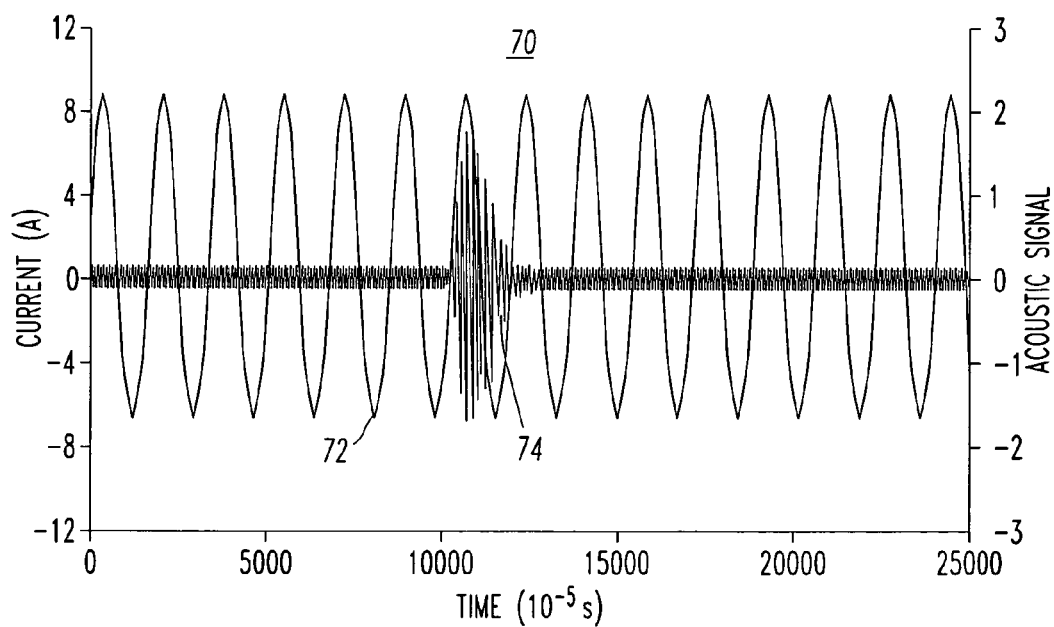
FIG. 4 is a plot of electrical alternating current and an acoustic pulse versus time as sensed with a relatively tight electrical connection of the load terminal screw of FIG. 1.

FIG. 4 shows a plot 70 of example electrical alternating current 72 and an example acoustic pulse 74 versus time as sensed with a relatively tight electrical connection of the load terminal screw 68 of FIG. 1.

EXAMPLE 17

Figure 5:
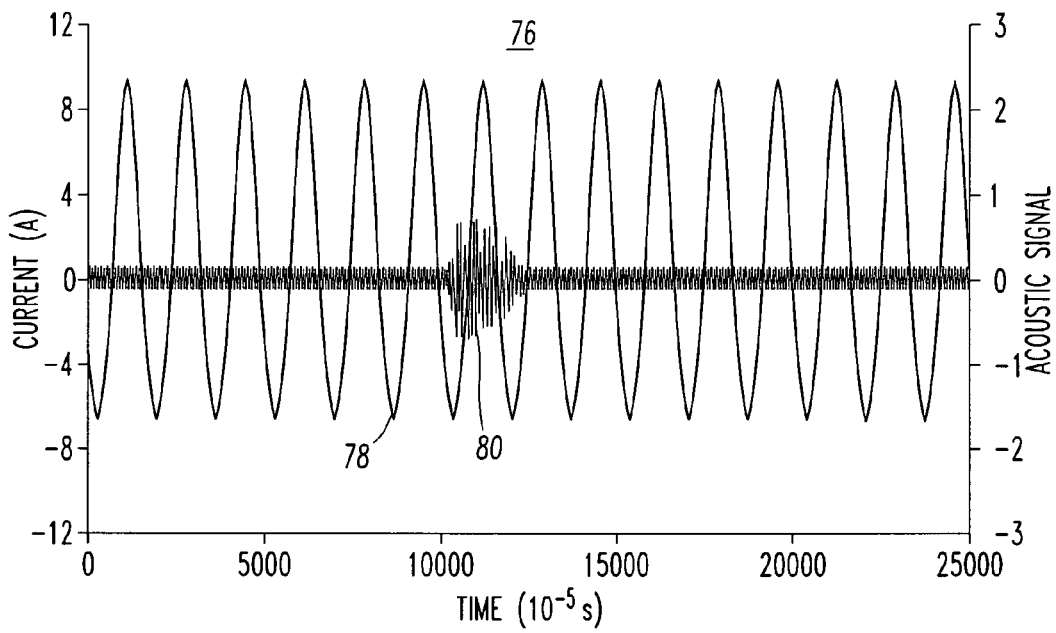
FIG. 5 is a plot of electrical alternating current and an acoustic pulse versus time as sensed with the load terminal screw of FIG. 1 being removed to provide a relatively loose electrical connection.

In contrast, FIG. 5 shows a plot 76 of example electrical alternating current 78 and an example acoustic pulse 80 versus time as sensed with the load terminal screw 68 being completely removed.

Figure 6:
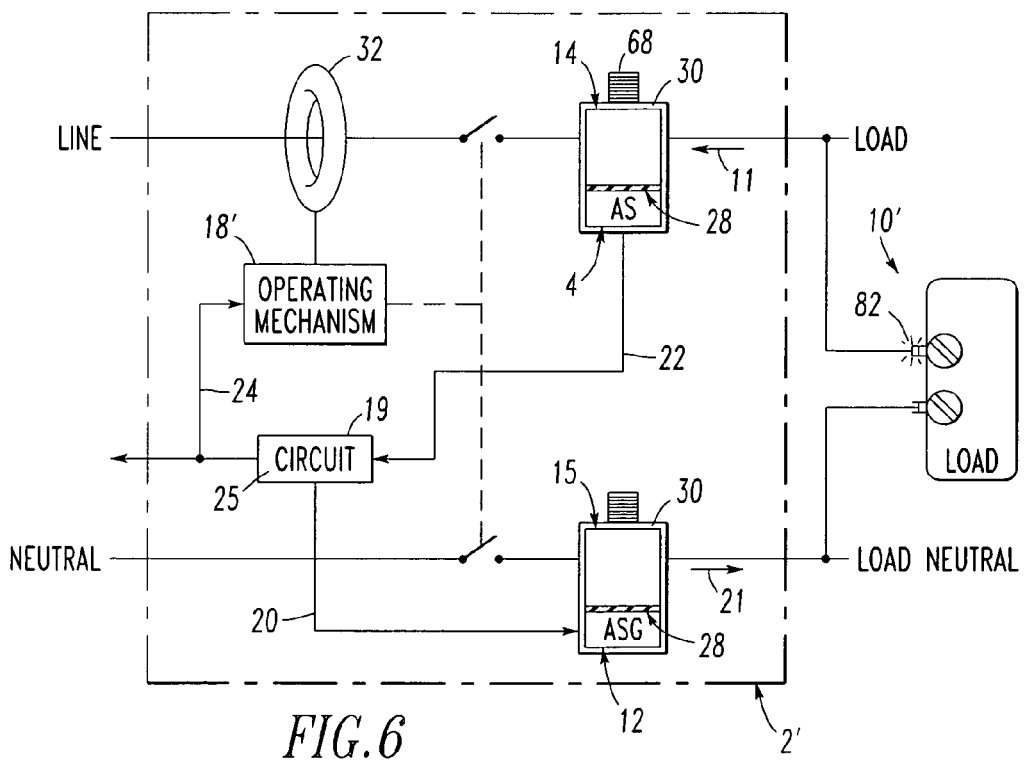
FIG. 6 is a block diagram of a receptacle employing an acoustic signal generator and an acoustic sensor in accordance with another embodiment of the invention.

FIG. 6 shows a receptacle 2' including an operating mechanism 18', the acoustic generator 12, the acoustic sensor 4 and the circuit 19 to detect a loose electrical connection 82 of a power circuit 10'.

The circuit 19 may employ a combination of one or more of analog, digital and/or processor-based circuits.

The acoustic signal generator 12 and the acoustic sensor 4 eliminate the possibility of damage to electrical circuitry associated with the power circuits 10,10'. Furthermore, the acoustic signal generator 12 and the acoustic sensor 4 do not distort the voltage of and the current flowing in those power circuits.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. An electrical switching apparatus for detecting an electrical conductivity fault of a power circuit, said electrical switching apparatus comprising:
   first and second lugs adapted to be electrically connected to said power circuit;
   a first acoustic coupler adapted to be acoustically coupled to said power circuit;
   a second acoustic coupler adapted to be acoustically coupled to said power circuit;
   separable contacts electrically connected in series between said first and second lugs;
   an operating mechanism adapted to open and close said separable contacts;
   an acoustic generator coupled to said second acoustic coupler, said acoustic generator being adapted to generate a first acoustic signal to said power circuit from said second acoustic coupler;
   an acoustic sensor coupled to said first acoustic coupler, said first acoustic coupler having a second acoustic signal which is operatively associated with the electrical conductivity fault of said power circuit, said acoustic sensor being adapted to output a sensed acoustic signal; and
   a circuit cooperating with said acoustic generator to generate said first acoustic signal, input the sensed acoustic signal and detect said electrical conductivity fault therefrom.

2. The electrical switching apparatus of claim 1 wherein said acoustic generator generates the first acoustic signal as a plurality of pulses having a predetermined frequency.

3. The electrical switching apparatus of claim 1 wherein said circuit is adapted to input a plurality of samples of the sensed acoustic signal, determine a plurality of magnitudes of said samples, determine an average magnitude from said magnitudes of said samples, determine a change in said average magnitude with respect to a first predetermined value for the sensed acoustic signal, and determine said electrical conductivity fault when said change is greater than a second predetermined amount.

4. The electrical switching apparatus of claim 3 wherein a count of said samples of the sensed acoustic signal is about five to about ten.

5. The electrical switching apparatus of claim 3 wherein said predetermined amount is about five percent.

6. The electrical switching apparatus of claim 1 wherein said electrical conductivity fault is a loose electrical connection.

7. The electrical switching apparatus of claim 1 wherein said electrical switching apparatus is a circuit interrupter; wherein said operating mechanism comprises a trip mechanism; and wherein said circuit outputs a trip signal to said trip mechanism upon detecting said electrical conductivity fault from said sensed acoustic signal.

8. The electrical switching apparatus of claim 1 wherein said second acoustic coupler is adapted to couple said first acoustic signal from said acoustic generator to said power circuit; and wherein said first acoustic coupler is adapted to couple said second acoustic signal from said power circuit to said acoustic sensor.

9. The electrical switching apparatus of claim 1 wherein said first acoustic coupler is an acoustic lug including a voltage adapted to be electrically output to said power circuit; and wherein said first acoustic coupler comprises an electrical insulator adapted to electrically insulate said acoustic sensor from said voltage.

10. The electrical switching apparatus of claim 1 wherein said first acoustic coupler comprises an acoustic insulator adapted to insulate said acoustic sensor from airborne noise.

11. The electrical switching apparatus of claim 1 wherein said acoustic sensor is a piezo electrical sensor.

12. The electrical switching apparatus of claim 1 wherein said electrical switching apparatus is a receptacle.

13. A method of detecting an electrical conductivity fault of a power circuit, said method comprising:
   employing a first acoustic coupler adapted to be acoustically coupled to said power circuit;
   employing a second acoustic coupler adapted to be acoustically coupled to said power circuit;
   generating a first acoustic signal from said second acoustic coupler to said power circuit;
   inputting a second acoustic signal from said first acoustic coupler, said second acoustic signal being operatively associated with the electrical conductivity fault of said power circuit, and outputting a sensed acoustic signal; and
   detecting said electrical conductivity fault from the sensed acoustic signal.

14. The method of claim 13 further comprising
   employing as said power circuit a direct current power circuit; and
   detecting said electrical conductivity fault in said direct current power circuit.

15. The method of claim 13 further comprising
   employing as said power circuit an alternating current power circuit; and
   detecting said electrical conductivity fault in said alternating current power circuit.

16. The method of claim 13 further comprising
   generating the first acoustic signal as a plurality of pulses having a predetermined frequency;
   inputting a plurality of samples of the sensed acoustic signal; and
   determining that a frequency of said samples matches said predetermined frequency before detecting said electrical conductivity fault from said samples.

17. The method of claim 13 further comprising
   outputting a trip signal to a trip mechanism to interrupt said electrical conductivity fault responsive to said detecting said electrical conductivity fault.

18. The method of claim 13 further comprising
   outputting an alarm responsive to said detecting said electrical conductivity fault.

19. The method of claim 13 further comprising
   employing as said electrical conductivity fault a loose electrical connection condition.

20. The method of claim 13 further comprising inputting a plurality of samples of the sensed acoustic signal;

determining a plurality of magnitudes of said samples;

determining an average magnitude from said magnitudes of said samples;

determining a change in said average magnitude with respect to a first predetermined value for the sensed acoustic signal; and determining said electrical conductivity fault when said change is greater than a second predetermined amount.

* * * * *